(12) United States Patent
Carapella et al.

(10) Patent No.: US 7,020,958 B1
(45) Date of Patent: Apr. 4, 2006

(54) METHODS FORMING AN INTEGRATED CIRCUIT PACKAGE WITH A SPLIT CAVITY WALL

(75) Inventors: Elissa E. Carapella, Chandler, AZ (US); Mark J. Palmer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 09/665,034

(22) Filed: Sep. 19, 2000

Related U.S. Application Data

(63) Continuation of application No. 09/153,630, filed on Sep. 15, 1998, now Pat. No. 6,153,829.

(51) Int. Cl.
*H05K 3/02* (2006.01)
*H05K 3/10* (2006.01)

(52) U.S. Cl. .............................. 29/846; 29/830; 29/832; 174/52.1; 257/680; 361/764; 361/777

(58) Field of Classification Search .................. 29/825, 29/830, 832, 846; 174/52.1; 257/712, 708, 257/675, 680; 361/761, 764, 777
See application file for complete search history.

(56) References Cited

U.S. PATENT DOCUMENTS

| | | | | |
|---|---|---|---|---|
| 4,223,321 A | * | 9/1980 | Kenworthy | 347/76 |
| 4,682,270 A | * | 7/1987 | Whitehead et al. | 361/764 |
| 4,891,687 A | | 1/1990 | Mallik et al. | |
| 5,089,878 A | * | 2/1992 | Lee | 357/71 |
| 5,206,986 A | * | 5/1993 | Arai et al. | 174/266 |
| 5,218,515 A | * | 6/1993 | Bernhardt | 361/689 |
| 5,488,257 A | | 1/1996 | Bhattacharyya et al. | |
| 5,491,362 A | * | 2/1996 | Hamzehdoost et al. | 257/712 |
| 5,491,632 A | | 2/1996 | Pawlak et al. | |
| 5,557,502 A | | 9/1996 | Banerjee et al. | |
| 5,625,166 A | | 4/1997 | Natarajan | |
| 5,726,860 A | | 3/1998 | Mozdzen | |
| 5,777,265 A | | 7/1998 | Bhattacharyya et al. | |
| 5,787,575 A | | 8/1998 | Banerjee et al. | |
| 5,801,450 A | | 9/1998 | Barrow | |
| 5,858,816 A | * | 1/1999 | Sato et al. | 438/125 |
| 5,877,553 A | * | 3/1999 | Nakayama et al. | 257/708 |
| 5,880,529 A | | 3/1999 | Barrow | |
| 6,008,532 A | | 12/1999 | Carichner | |
| 6,014,809 A | * | 1/2000 | Sebesta | 29/896 |
| 6,020,631 A | | 2/2000 | Mozdzen | |
| 6,031,283 A | | 2/2000 | Banerjee et al. | |
| 6,073,344 A | * | 6/2000 | Japp et al. | 29/830 |
| 6,153,829 A | | 11/2000 | Carapella et al. | |

* cited by examiner

*Primary Examiner*—Richard Chang
(74) *Attorney, Agent, or Firm*—Blakely, Sokoloff, Taylor & Zafman LLP

(57) ABSTRACT

Methods of assembling an electronic package including forming a housing with a first bond pad on a top surface of a bond shelf, forming a conductive strip along a side surface or edge of the bond shelf, and removing a portion of the conductive strip to form a pair of separate conductive strips. The conductive strip may be formed by plating a conductive material onto the bond shelf into unmasked areas thereof. The conductive strip may include a portion that extends around from the side surface to the top surface of the bond shelf to form a bond pad or couple to a bond pad on the top surface. The extended portion may also anchor the conductive strip and the separate conductive strips to the housing and reduce the likelihood of delamination during removal of the portion of the conductive strip to form the separate conductive strips.

23 Claims, 3 Drawing Sheets

METHODS FORMING AN INTEGRATED CIRCUIT PACKAGE WITH A SPLIT CAVITY WALL

CROSS REFERENCE TO RELATED APPLICATION

This application claims the benefit of and is a continuation of application Ser. No. 09/153,630, filed Sep. 15, 1998, now issued as U.S. Pat. No. 6,153,829.

BACKGROUND OF THE INVENTION

1. Field of the Invention

The present invention relates to an integrated circuit package.

2. Description of Related Art

Integrated circuits are typically housed within a package which has a plurality of external contacts that are soldered to a printed circuit board. The package may also have a number of internal bond pads that are connected to corresponding pads of the integrated circuit by bond wires or a tape automated bonding (TAB) tape. The internal bond pads may be connected to the external contacts by routing layers and busses within the package. The busses and routing layers have conductive planes and traces that are dedicated to the power/ground busses and digital signal lines of the integrated circuit, respectively. By way of example, a conventional package may have a first bus layer dedicated to power, one or more routing layers dedicated to digital signals and a second bus layer dedicated to ground.

The various conductive layers are spatially located within different planes in the package. The layers are typically interconnected by conductive vias formed within the package. The bond pads may also be connected to the internal conductive layers by vias. Vias are typically formed by creating a hole in the dielectric package material and then plating the hole with a conductive material such as copper. The plating process is a relatively time consuming and expensive step. For this reason it is desirable to create an integrated circuit package with a minimal number of vias.

Some integrated circuits require power at different voltage levels. For example, an integrated circuit may require both 3.3 V and 2.0 V power. The additional voltage level requires an additional conductive power plane within the package. The second power plane can be created by forming an additional conductive layer within the package. The additional conductive layer requires more vias to connect the second power plane to the bond pads. It would be desirable to provide a dual voltage integrated circuit package which minimized the number of vias required to interconnect the pads and conductive layers of the package.

U.S. Pat. No. 5,557,502, issued to Banerjee et al., discloses an integrated circuit package which has a conductive strip that wraps around an edge of a bond shelf to interconnect a power bus to one or more bond pads on the shelf. The conductive strip is typically formed by initially masking all surfaces of the integrated circuit package except for the edge, and then dipping the package into a plating bath of copper. The plating bath plates copper onto the edge on the bond shelf.

The conductive copper strip extends continuously along the entire edge of the bond shelf. Because of this only one voltage level can be supplied to the contact pads located on the bond shelf with the plated edge. To provide more design flexibility it would be desirable to connect multiple power/ground planes to the bond pads on the bond shelf with the conductive strip.

SUMMARY OF THE INVENTION

The present invention is an electronic package that may include a first bond pad and a second bond pad located on a bond shelf. The bond shelf may have an edge. The package may have a first conductive bus that may be connected to the first bond pad by a first conductive strip that extends along the edge of the bond shelf. The package may also have a second conductive bus that may be connected to the second bond pad by a second conductive strip that extends along the edge of the bond shelf.

DETAILED DESCRIPTION OF THE INVENTION

Figure 1:
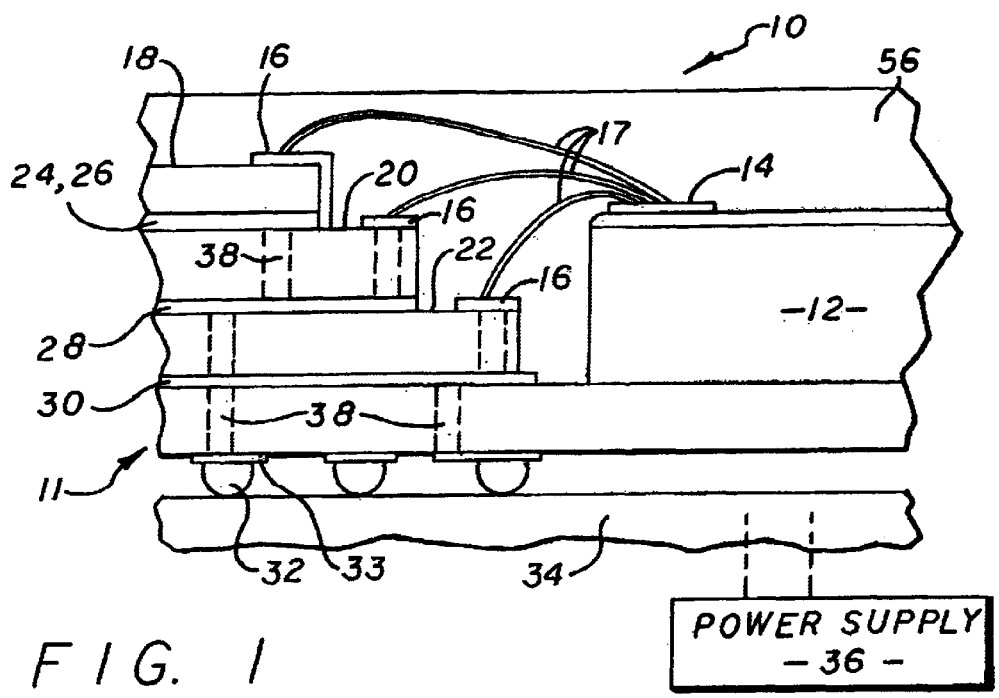
FIG. 1 is a cross-sectional view of an integrated circuit package of the present invention.
Figure 2:
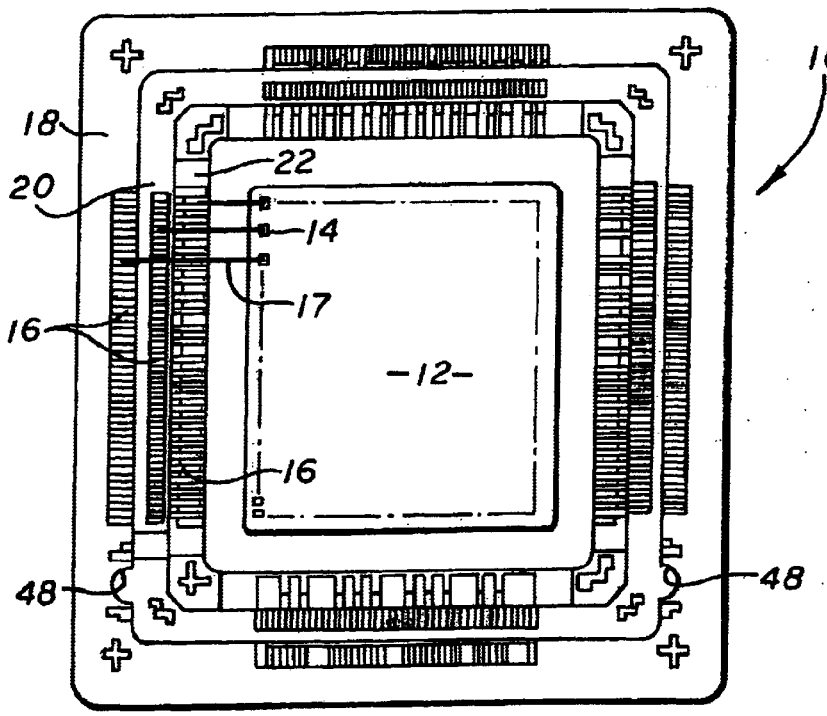
FIG. 2 is a top sectional view of the package.
Figure 3:
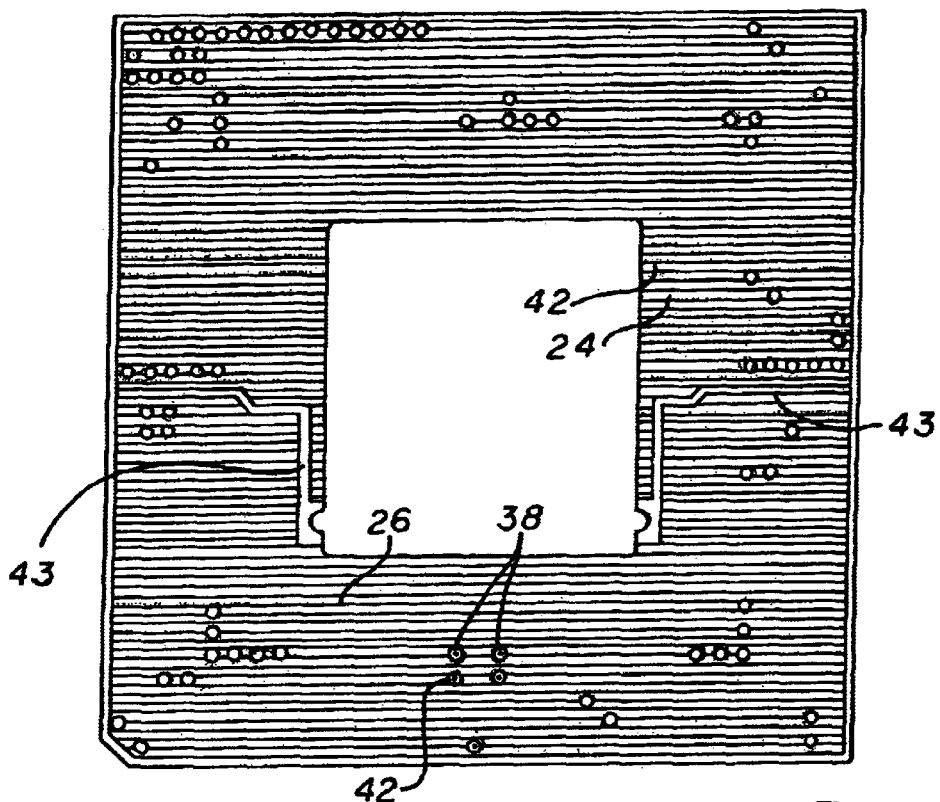
FIG. 3 is a top cross-sectional view of the integrated circuit package showing a pair of power busses within the same plane of the package.

Referring to the drawings more particularly by reference numbers, FIGS. 1–3 show an integrated circuit package 10 of the present invention. Mounted to the package 10 is an integrated circuit 12. Although an integrated circuit 12 is shown and described, it is to be understood that the package may house any passive or active electrical device. The integrated circuit 12 has a plurality of bond pads 14 that are connected to corresponding bond pads 16 of a package housing 11. The bond pads 14 and 16 may be connected by bond wires 17 or a tape automated bonding (TAB) tape (not shown). The bond pads 16 may be located on a first bond shelf 18, a second bond shelf 20 and a third bond shelf 22. Although three bond shelves are shown and described, it is to be understood that the package 10 may have any number of bond shelves.

The bond pads 16 of the first bond shelf 18 are connected to a pair of power busses 24 and 26 within the package. The busses 24 and 26 are separated and located within the same horizontal plane of the package. By locating both power busses 24 and 26 within the same plane the present invention provides a package that may require less layers than a package that has two power busses located within different layers of the package.

The package 10 may also have one or more layers of routing traces 28 and a ground bus 30 dedicated to the digital signal lines and ground of the integrated circuit 12, respectively. The busses 24, 26 and 30, and traces 28 are connected to a plurality of contacts 32 that are attached to surface pads 33 located on a bottom surface of the package 10. The contacts 32 may be solder balls that are reflowed onto a printed circuit board 34. By way of example, the printed circuit board 34 may be a motherboard of a computer that contains a power supply(ies) 36 that provides two different voltage levels of power.

In one embodiment, the power bus 24 is connected to one voltage level, such as 3.3 V, and the other power bus 26 can be connected to a second voltage level, such as 2.0 V. In this manner the package provides two different voltage levels to the integrated circuit 12. Although the busses 24 and 26 are described as being both dedicated to power, it is to be understood that one bus may be connected to power and the as other bus may be connected to ground. Such a configuration may reduce the capacitance of the package 10. Additionally, although solder balls 32 are shown and described, it is to be understood that the package 10 may have other types of contacts such as pins (not shown) that are soldered to the printed circuit board 34.

The bond pads 16 and layers of busses 24 and 26, routing traces 28, bus 30, and contacts 32 may all be interconnected by vias 38. The busses 24 and 26 may include clearance spaces 42 that electrically isolate the busses 24 and 26 from the vias 38. Additionally, the busses 24 and 26 are also separated by spaces 43.

Figure 4:
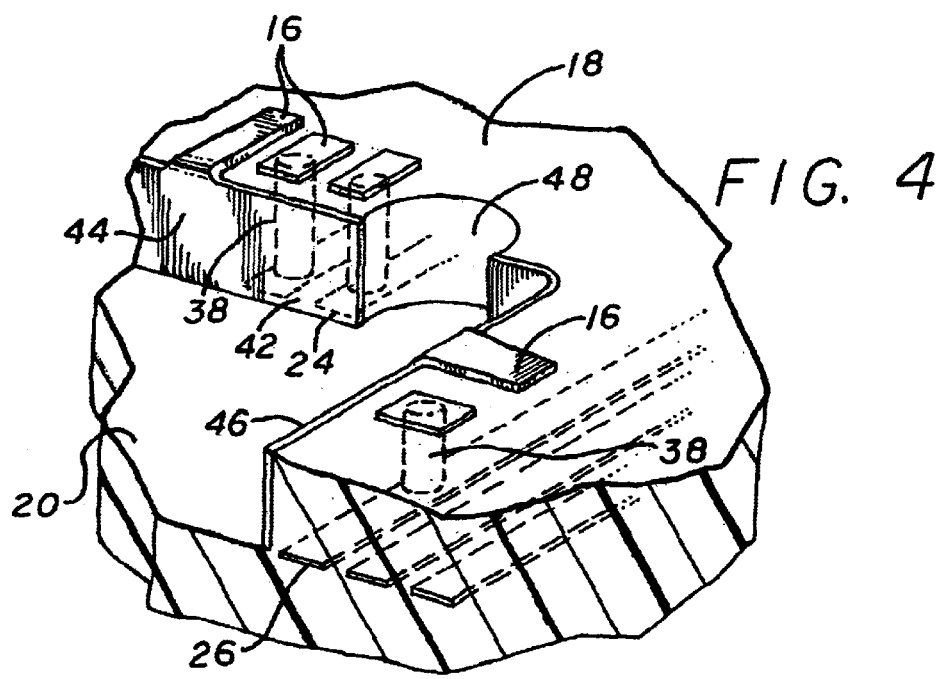
FIG. 4 is an enlarged perspective view of a bond shelf of the package showing a pair of conductive strips that wrap around the edge of a bond shelf to connect a pair of conductive busses to bond pads located on the shelf.

FIG. 4 shows a first conductive strip 44 and a second conductive strip 46 that wrap around an edge of the first bond shelf 18 to connect the bond pads 16 to the power busses 24 and 26. The conductive strips 44 and 46 can be separated by a pair of notches 48 formed in the first bond shelf 18. Some of the bond pads 16 are connected to bus 24 by conductive strip 44 while other bond pads 16 are connected to bus 26 by strip 46. The separate strips allow the bond pads 16 on the first bond shelf 18 to be connected to two different voltage levels. The other bond pads 16 on the first bond shelf 18 may be interconnected to other layers and/or contacts 32 by vias 38.

In the preferred embodiment, the package 10 is constructed with a laminated printed circuit board process. The ground layer 30 can be formed on a dielectric substrate with conventional photolithographic techniques. A second substrate may be placed on the ground layer 30. The layer may have a plurality of holes used for the formation of the vias 38. The second substrate may contain copper layers that are etched to form the routing traces 28 and bond pads 16. Additional substrates may be added to create the busses 24 and 26, and bond pads 16. The vias 38 can then be formed with a plating process. The substrates are then "auto-claved" to form the package housing 11.

Figure 5:
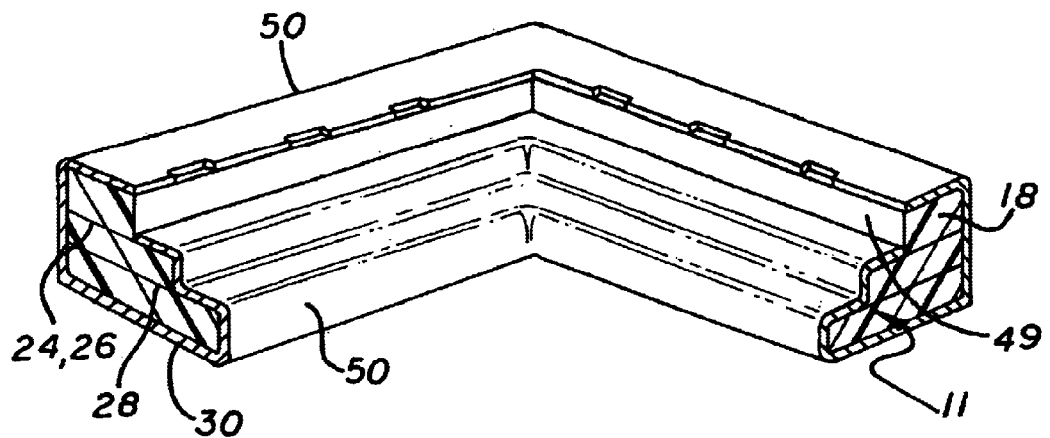
FIG. 5 is a perspective view showing the package masked by a plating resist material.
Figure 6:
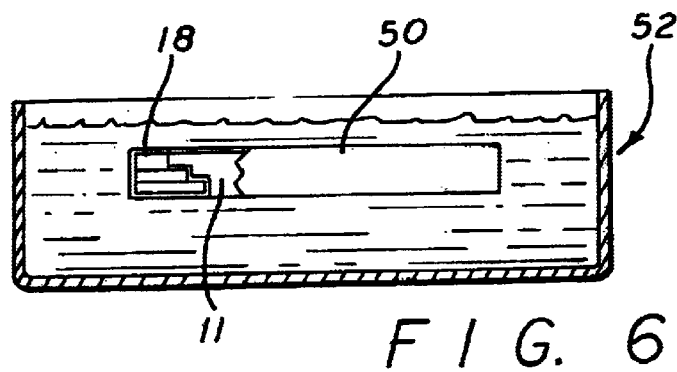
FIG. 6 is a side view showing the package within a plating bath.

The conductive strips 44 and 46 can be formed by initially masking off all surfaces of the package housing, except the edge 49 of the first bond shelf 18 with a plating resist maskant 50, as shown in FIG. 5. The masked housing can then be dipped into a plating bath 52 as shown in FIG. 6. The plating bath 52 plates a conductive material such as copper onto the edge 49 of the first bond shelf 18. The maskant 50 is then removed and the notches 48 can be drilled into the edges of the first bond shelf 18 to separate the plated material into the first and second conductive strips 44 and 46. All exposed copper surfaces may then be plated with gold.

Figure 7:
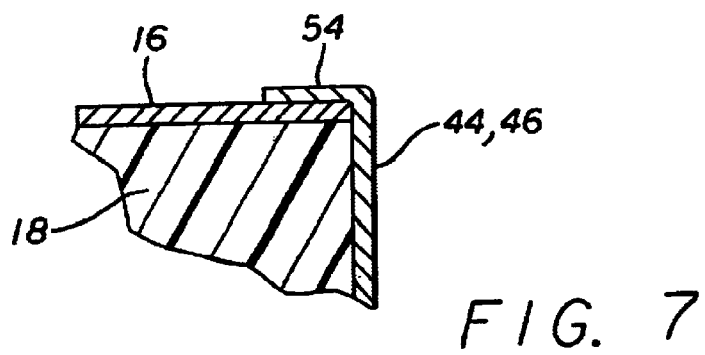
FIG. 7 is an enlarged view of a conductive strip that extends along an edge of a bond shelf.

As shown in FIG. 7, portions 54 of the conductive strips 44 and 46 may extend onto the first bond shelf 18 to connect to a bonding pad 16. The extra portions 54 may further anchor the conductive strips 44 and 46 to the housing and reduce the likelihood of delamination during the drilling process. The additional portions 54 can be formed by not masking the end of the first bond shelf 18 so that conductive material plates onto the shelf.

Referring to FIGS. 1 and 2, after the strips 44 and 46 are formed, the integrated circuit 12 may be mounted onto the package and connected to the bond pads 16. The integrated circuit 12 may then be enclosed with an encapsulant 56. The contacts 32 are attached to the surface pads 33 to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for assembling an electronic package, comprising:

forming a housing which has a bond pad located on a top surface of a bond shelf, the bond shelf having an inner side surface along a thickness of the bond shelf;

forming a conductive strip lengthwise along the inner side surface of the bond shelf; and removing a portion of the conductive strip along the inner side surface of the bond shelf to form a pair of separate conductive strips lengthwise along the inner side surface of the bond shelf, the portion of the conductive strip is removed by drilling a portion of the inner side surface of the bond shelf including the conductive strip.

2. The method as recited in claim 1, wherein the conductive strip is formed by plating a conductive material onto the inner side surface of the bond shelf.

3. The method as recited in claim 1, further comprising:

mounting an integrated circuit to the housing and connecting the integrated circuit of the bond pad.

4. The method as recited in claim 1, wherein the conductive strip is formed along the inner side surface of the bond shelf by masking surfaces of the bond shelf except for portions of the bond shelf to be plated, the inner side surface of the bond shelf being unmasked, and plating a conductive material onto the inner side surface of the bond shelf.

5. The method as recited in claim 4, wherein the conductive material is copper, and the conductive strip is further formed by plating gold onto the copper.

6. The method as recited in claim 1, wherein the forming of the conductive strip further includes forming a portion of the conductive strip around onto the top surface of the bond shelf to couple to the bond pad on the top surface of the bond shelf.

7. The method as recited in claim 6, wherein the portion of the conductive strip around on the top surface of the bond shelf to further anchor the conductive strip to the housing. shelf to couple to the bond pad on the top surface of the bond shelf.

8. The method as recited in claim 1, wherein the forming of the conductive strip further includes forming a portion of the conductive strip around onto the top surface of the bond shelf to form another bond pad on the top surface of the bond shelf.

9. The method as recited in claim 8, wherein the portion of the conductive strip around on the top surface of the bond shelf to further anchor the conductive strip to the housing.

10. A method for assembling an electronic package, comprising:

forming a housing which has a bond pad located on top surface of a bond shelf, the bond shelf having an inner side surface along a thickness of the bond shelf;

forming a conductive strip lengthwise along the inner side of the bond shelf; and removing a portion of the conductive strip along the inner side surface of the bond shelf to form a pair of separate conductive strips lengthwise along the inner side surface of the bond shelf, the portion of the conductive strip is removed by the drilling a portion of the bond shelf.

11. A method for assembling an electronic package, comprising:

forming a housing which has a bond pad located on a top surface of a bond shelf, the bond shelf having an inner side surface along a thickness of the bond shelf;

forming a conductive strip lengthwise along the inner side surface of the bond shelf; and removing a portion of the conductive strip along the inner side surface of the bond shelf to form a pair of separate conductive strips lengthwise along the inner side surface of the bond shelf, the portion of the conductive material is removed by drilling into the edge of the bond shelf including the conductive material and the inside surface.

12. The method of claim 11, wherein, the plating of the conductive material onto the inside surface of the bond shelf includes masking surfaces of the housing that are not to be plated and leaving surfaces of the housing unmasked that are to be plated, including the inside surface of the bond shelf that is to be plated.

13. The method of claim 12, wherein the plating of the conductive material further includes plating copper onto the unmasked surfaces of the housing, and plating of gold onto the copper.

14. The method of claim 13, wherein, the portion of the conductive material is removed by drilling into the edge of the bond shelf including the conductive material and the inside surface.

15. The method of claim 11, wherein the plating of the conductive material further includes plating a portion of the conductive material from the inside surface around onto the top surface of the bond shelf to couple to the bond pad on the top surface of the bond shelf.

16. The method of claim 15, wherein the portion of the conductive material plated around onto the inside surface of the bond shelf to further anchor the conductive material to the housing.

17. The method of claim 11, wherein the plating of the conductive material further includes plating a portion of the conductive material from the inside surface around onto the top surface of the bond shelf to couple to the bond pad on the top surface of the bond shelf.

18. The method of claim 17, wherein the portion of the conductive material plated around onto the top surface of the bond shelf to further anchor the conductive material to the housing.

19. The method of claim 11, further comprising:

mounting an integrated circuit to the housing and connecting the integrated circuit to the bond pad.

20. A mmethod for assembling an electronic package, comprising:

forming a housing which has a plurality of bond pads located on a top surface of a bond shelf, the bond shelf forming a rectangular cavity wall along an inner side of the bond shelf;

forming a conductive strip lengthwise along the rectangular cavity wall of the bond shelf; and removing portions of the conductive strip along the rectangular cavity wall of the bond shelf to form a plurality of separate conductive srips along the rectangular cavity wall of the bond shelf, portion sof the conductive strip are removed by drilling a portion of the rectangular cavity wall of the bond shelf including conductive strip.

21. The method as recited in claim 20, wherein the conductive strip is formed by plating a conductive material onto the rectangular cavity wall of the bond shelf.

22. The method as recited in claim 20, further comprising:

mounting an integrated circuit to the housing and connecting the integrated circuit to at least one of the plurality of bond pads.

23. The method as recited in claim 20, wherein the conductive strip is formed along the rectangular cavity wall of the bond shelf by masking surfaces of the bond shelf except for portions of the bond shelf to be plated, the rectangular cavity wall of the bond shelf being unmasked, and plating a conductive material onto the rectangular cavity wall of the bond shelf.

\* \* \* \* \*